(12) United States Patent
Heo et al.

(10) Patent No.: US 11,527,646 B2
(45) Date of Patent: Dec. 13, 2022

(54) DOMAIN SWITCHING DEVICES AND METHODS OF MANUFACTURING THE SAME

(71) Applicant: Samsung Electronics Co., Ltd., Suwon-si (KR)

(72) Inventors: Jinseong Heo, Seoul (KR); Sangwook Kim, Seongnam-si (KR); Yunseong Lee, Osan-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/026,665

(22) Filed: Sep. 21, 2020

(65) Prior Publication Data

US 2021/0091227 A1 Mar. 25, 2021

(30) Foreign Application Priority Data

Sep. 24, 2019 (KR) ......................... 10-2019-0117483

(51) Int. Cl.
*H01L 29/78* (2006.01)
*H01L 21/28* (2006.01)
(Continued)

(52) U.S. Cl.
CPC ...... *H01L 29/78391* (2014.09); *G11C 11/223* (2013.01); *H01L 29/40111* (2019.08); *H01L 29/6684* (2013.01)

(58) Field of Classification Search
CPC ......... H01L 29/78391; H01L 29/40111; H01L 29/6684; H01L 21/28176; H01L 21/28185; H01L 21/28194; H01L 29/4966; H01L 29/513; H01L 29/78; H01L 29/517; H01L 21/67011; H01L 21/67098;
(Continued)

(56) References Cited

U.S. PATENT DOCUMENTS 8,476,155 B1 7/2013 Lim et al.
9,853,150 B1* 12/2017 Colinge ............... H01L 27/1159
(Continued)

FOREIGN PATENT DOCUMENTS

CN 101593755 B 2/2012
JP 2017-059751 A 3/2017
WO WO-2009/128133 A1 10/2009

OTHER PUBLICATIONS

Karda, Kamal et al., "An anti-ferroelectric gated Landau transistor to achieve sub-60 mV/dec switching at low voltage and high speed", Applied Physics Letters, vol. 106, No. 163501, Apr. 21, 2015.
(Continued)

*Primary Examiner* — Sheikh Maruf
(74) *Attorney, Agent, or Firm* — Harness, Dickey & Pierce, P.L.C.

(57) ABSTRACT

A domain switching device includes a channel region, a source region and a drain region connected to the channel region, a gate electrode isolated from contact with the channel region, an anti-ferroelectric layer between the channel region and the gate electrode, a conductive layer between the gate electrode and the anti-ferroelectric layer to contact the anti-ferroelectric layer, and a barrier layer between the anti-ferroelectric layer and the channel region.

26 Claims, 21 Drawing Sheets

(51) Int. Cl.
*G11C 11/22* (2006.01)
*H01L 29/66* (2006.01)

(58) Field of Classification Search
CPC ......... H01L 29/66477; H01L 21/02172; H01L 21/324; H01L 29/516; G11C 11/223
USPC .......................................................... 257/43
See application file for complete search history.

(56) References Cited

U.S. PATENT DOCUMENTS

| | | | | |
|---|---|---|---|---|
| 2002/0038402 | A1* | 3/2002 | Kanaya | H01L 21/76829 711/1 |
| 2006/0027882 | A1* | 2/2006 | Mokhlesi | H01L 27/11521 257/410 |
| 2006/0197227 | A1* | 9/2006 | Liang | H01L 29/513 257/761 |
| 2008/0079111 | A1* | 4/2008 | Clark | H01L 21/02175 257/506 |
| 2009/0079015 | A1* | 3/2009 | Bhattacharyya | H01L 21/0217 257/410 |
| 2014/0197459 | A1* | 7/2014 | Kis | H01L 29/40111 257/194 |
| 2015/0017813 | A1* | 1/2015 | Akiyama | H01L 29/517 438/763 |
| 2015/0102431 | A1 | 4/2015 | Chi et al. | |
| 2015/0214322 | A1* | 7/2015 | Mueller | H01L 29/6684 257/532 |
| 2015/0287802 | A1* | 10/2015 | Lee | H01L 21/823462 257/105 |
| 2015/0303313 | A1* | 10/2015 | Mallela | H01L 29/0847 257/295 |
| 2015/0340372 | A1* | 11/2015 | Pandey | H01L 29/6684 257/295 |
| 2016/0064524 | A1* | 3/2016 | Chuang | H01L 29/41775 438/268 |
| 2016/0172248 | A1* | 6/2016 | Peng | H01L 21/823412 438/275 |
| 2016/0284540 | A1* | 9/2016 | Ray | C23C 16/50 |
| 2016/0308021 | A1* | 10/2016 | Lee | H01L 29/66356 |
| 2016/0336312 | A1* | 11/2016 | Yan | H01L 29/40111 |
| 2017/0141235 | A1* | 5/2017 | Lai | H01L 29/6684 |
| 2017/0162587 | A1* | 6/2017 | Chavan | H01L 29/4966 |
| 2017/0178712 | A1* | 6/2017 | Van Houdt | G11C 11/2273 |
| 2017/0200798 | A1* | 7/2017 | Chen | H01L 21/28088 |
| 2017/0207225 | A1* | 7/2017 | Mueller | H01L 27/10855 |
| 2017/0345831 | A1 | 11/2017 | Chavan et al. | |
| 2017/0365663 | A1* | 12/2017 | Zhao | H01L 29/7391 |
| 2017/0365719 | A1* | 12/2017 | Chen | H01L 21/02274 |

OTHER PUBLICATIONS

Extended European Search Report dated Jan. 26, 2021 for corresponding European Application No. 20197678.4.

* cited by examiner

DOMAIN SWITCHING DEVICES AND METHODS OF MANUFACTURING THE SAME

CROSS-REFERENCE TO RELATED APPLICATION

This application claims the benefit, under 35 U.S.C. § 119, of Korean Patent Application No. 10-2019-0117483, filed on Sep. 24, 2019, in the Korean Intellectual Property Office, the disclosure of which is incorporated herein in its entirety by reference.

BACKGROUND

1. Field

The present disclosure relates to domain switching devices and methods of manufacturing the same.

2. Description of Related Art

Operating characteristics and scaling down of existing silicon-based transistors are limited.

As nano manufacturing technologies develop, manufacturing transistor devices having smaller sizes has been enabled. However, there is a limit in the minimum voltage needed for driving a transistor due to the Boltzmann distribution of electrons. For example, in existing silicon-based transistors, when an operating voltage and current characteristics are measured, a subthreshold swing (SS) value is given as shown in Equation 1 below, and the SS value is known to be about 60 mV/dec at its minimum.

$$SS = \frac{k_B T}{q}\ln(10)\left(1 + \frac{C_D}{C_{ins}}\right) \quad (1)$$

In Equation 1, "$k_B$" denotes a Boltzmann constant, "T" denotes an absolute temperature, "q" denotes an elementary charge, "$C_D$" denotes capacitance of a depletion layer, "$C_{ins}$" denotes capacitance of a gate insulator, and ($k_B T/q$) denotes thermal Voltage.

As the size of a transistor decreases, it may become difficult to reduce the operation voltage of the transistor under about 0.8 V, and accordingly, power density is increased. Accordingly, when the distribution density of a device is increased, heat (e.g., heat generated by the device) may cause device failure (e.g., the probability of device failure due to the generated heat may be increased with increased distribution density), and thus, there may be a limitation in scaling down of a device.

SUMMARY

Provided are a domain switching device having a low operating voltage and a method of manufacturing the same. The domain switching device may be capable of improving operating characteristics such as SS, and enhancing control efficiency while being advantageous for scaling down.

Additional aspects will be set forth in part in the description which follows and, in part, will be apparent from the description, or may be learned by practice of the presented embodiments of the disclosure.

According to some example embodiments, a domain switching device includes a channel region, a source and a drain connected to the channel region, a gate electrode isolated from contact with the channel region, an anti-ferroelectric layer between the channel region and the gate electrode, a conductive layer between the gate electrode and the anti-ferroelectric layer, the conductive layer in contact with the anti-ferroelectric layer, and a barrier layer between the anti-ferroelectric layer and the channel region.

At least a portion of the anti-ferroelectric layer adjacent to the conductive layer may be crystallized.

The anti-ferroelectric layer may include ZrO at a ratio of over 50% in a surface area of a surface of the anti-ferroelectric layer that is in contact with the conductive layer and defines an interface area of an interface with the conductive layer.

The conductive layer may include a material having a surface resistance less than about 1 MΩ/square.

A thermal expansion coefficient of the conductive layer may be smaller than a thermal expansion coefficient of the anti-ferroelectric layer.

A thermal expansion coefficient of the conductive layer may be greater than a thermal expansion coefficient of the Mo.

The conductive layer may include a metal nitride, a metal oxynitride, RuO, MoO, or WO.

The barrier layer may have a breakdown voltage greater than a breakdown voltage of the anti-ferroelectric layer.

The barrier layer may include at least one of SiO, AlO, HfO, ZrO, LaO, YO, or MgO, or may include a material including a dopant in any one of SiO, AlO, HfO, ZrO, LaO, YO, MgO, or a 2D insulator.

The domain switching device may further include a dielectric layer between the barrier layer and the channel region.

The dielectric layer may include a different total material composition than a total material composition of the barrier layer.

A dielectric constant of the barrier layer may be greater than a dielectric constant of the dielectric layer.

The dielectric layer may include SiO, AlO, HfO, ZrO, or a 2D insulator.

The anti-ferroelectric layer may include at least one of HfO, ZrO, SiO, AlO, CeO, YO, or LaO.

The anti-ferroelectric layer may further include a dopant, and the dopant may include at least one of Si, Al, Zr, Y, La, Gd, Sr, Hf, or Ce.

The channel region may include at least one of Si, Ge, SiGe, a Group III-V semiconductor, oxide semiconductor, nitride semiconductor, oxynitride semiconductor, 2D material, quantum dot, transition metal dichalcogenide, or organic semiconductor.

According to some example embodiments, a method of manufacturing a domain switching device includes preparing a substrate including a channel region, forming, on the channel region, a lamination structure including a barrier layer, a domain switching layer, and a conductive layer, forming an electrode material layer on the lamination structure, and inducing anti-ferroelectricity in the domain switching layer.

The domain switching layer may include at least one of HfO, ZrO, SiO, AlO, CeO, YO, or LaO.

The conductive layer may include a metal nitride, a metal oxynitride, RuO, MoO, or WO.

The inducing of the anti-ferroelectricity in the domain switching layer may include crystallizing at least a partial area of the domain switching layer adjacent to the conductive layer.

The inducing of the anti-ferroelectricity in the domain switching layer may include applying, by the conductive layer, tensile stress to the domain switching layer.

The inducing of the anti-ferroelectricity in the domain switching layer may include annealing the lamination structure.

The annealing of the lamination structure may be performed before the electrode material layer is formed after the lamination structure is formed, and/or after the electrode material layer is formed.

According to some example embodiments, a method of manufacturing an electronic device may include forming a domain switching device according to the method according to some example embodiments, and fabricating the electronic device based on incorporating the domain switching device into an electronic device component.

The electronic device component may include at least one of a processing circuitry or a memory.

According to some example embodiments, a system for forming a domain switching device may include a process chamber including a pedestal or chuck configured to structurally support a substrate having a channel region in the process chamber, a plurality of composition sources and a plurality of control devices, and an electronic device. Each composition source may be coupled to the process chamber via a separate control device. Each control device may be configured to control a supply of a separate material held in a separate coupled composition source to the process chamber. The electronic device may be configured to control at least the plurality of control devices to form, on the channel region, a lamination structure including a barrier layer, a domain switching layer, and a conductive layer, form an electrode material layer on the lamination structure, and induce anti-ferroelectricity in the domain switching layer.

The system may further include a heat source configured to heat at least a portion of the process chamber. The electronic device may be configured to control the heat source to cause annealing of the lamination structure to induce the anti-ferroelectricity in the domain switching layer.

The electronic device may be configured to control the heat source to cause the annealing of the lamination structure to be performed before the electrode material layer is formed after the lamination structure is formed, and/or after the electrode material layer is formed.

The electronic device may be configured to control at least the plurality of control devices to prepare the substrate to include the channel region prior to forming the lamination structure on the channel region, based on injecting dopants into two separate regions of the substrate, the two separate regions isolated from contact with each other, to form a source and a drain in the two separate regions and to define the channel region as a region external to and between the source and the drain in the substrate.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
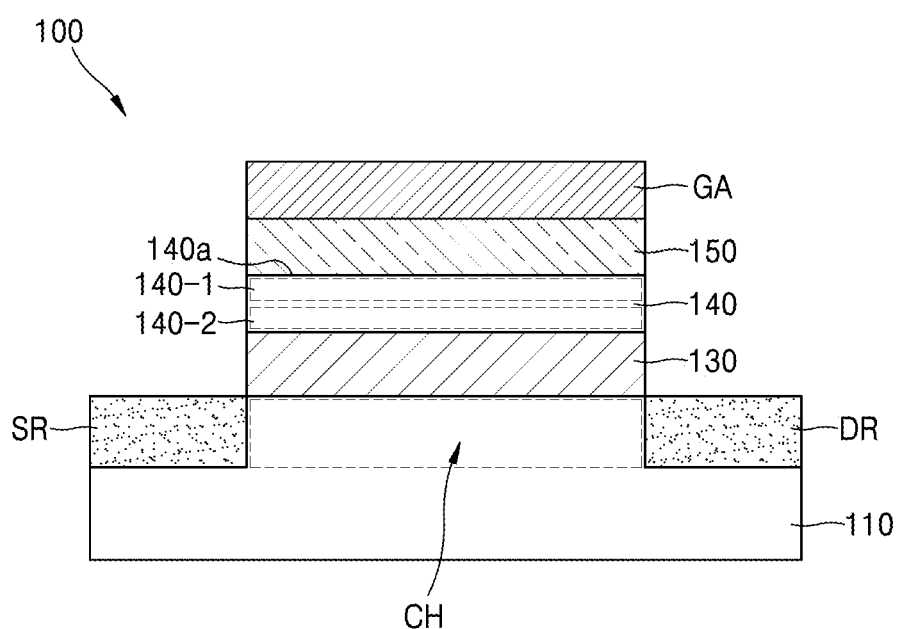
FIG. 1 is a schematic cross-sectional view of a domain switching device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, a layer structure, when a constituent element is disposed "above" or "on" to another constituent element, the constituent element may be only directly on the other constituent element or above the other constituent elements in a non-contact manner. For example, it will be understood that, when an element is described herein to be "on" another element, the element may be "directly" on the other element, such that the element is in contact with the other element, or the element may be "indirectly" on the other element, such that the element is isolated from contact with the other element by one or more interposing structures and/or spaces.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, energy levels, energy barriers, or the like) described herein as being the "substantially" the same encompasses elements and/or properties thereof (e.g., structures, properties of one or more elements, lengths, distances, energy levels, energy barriers, or the like) that are the same within manufacturing tolerances and/or material tolerances and/or elements and/or properties thereof (e.g., structures, properties of one or more elements, lengths, distances, energy levels, energy barriers, or the like) that have a relative difference in magnitude that is equal to or less than 10%. Further, regardless of whether elements and/or properties thereof (e.g., structures, properties of one or more elements, lengths, distances, energy levels, energy barriers, or the like) are modified as "substantially," it will be understood that these elements and/or properties thereof (e.g., structures, properties of one or more elements, lengths, distances, energy levels, energy barriers, or the like) should be construed as including a manufacturing or operational tolerance (e.g., ±10%) around the stated elements and/or properties thereof (e.g., structures, properties of one or more elements, lengths, distances, energy levels, energy barriers, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where elements, properties, or the like are described herein to have a "small" or "very small" difference between each other, it will be understood that a variation between the magnitudes of said elements and/or properties may be equal to or less than 10% of the magnitudes of the elements, properties, or the like being described.

Terms such as "first" and "second" are used herein merely to describe a variety of constituent elements, but the constituent elements are not limited by the terms. Such terms are used only for the purpose of distinguishing one constituent element from another constituent element. There terms do not limit that the materials or structures of constituent elements are different from each other.

As used herein, the singular forms are intended to include the plural forms as well, unless the context clearly indicates otherwise. When a portion "includes" an element, another element may be further included, rather than excluding the existence of the other element, unless otherwise described.

Furthermore, terms such as " . . . unit", "~module", etc. stated in the specification may signify a unit to process at least one function or operation and the unit may be embodied by hardware, software, or a combination of hardware and software.

The use of the terms "a", "an", "the", and similar referents in the context of describing the disclosure are to be construed to cover both the singular and the plural.

The steps of all methods described herein can be performed in any suitable order unless otherwise indicated herein or otherwise clearly contradicted by context. Furthermore, the use of any and all examples, or language (e.g., "such as") provided herein, is intended merely to better illuminate the disclosure and does not pose a limitation on the scope of the disclosure unless otherwise claimed.

FIG. 1 is a schematic cross-sectional view of a domain switching device 100 according to some example embodiments.

Referring to FIG. 1, the domain switching device 100 may include a channel region CH, a source SR and a drain DR which are each connected to the channel region CH, a gate electrode GA disposed apart from (e.g., isolated from contact with) the channel region CH, and a conductive layer 150, an anti-ferroelectric layer 140, and a barrier layer 130, which are disposed between the gate electrode GA and the channel region CH, e.g., in a vertical direction as shown in FIG. 1. As shown, the conductive layer 150, the anti-ferroelectric layer 140, and the barrier layer 130 may be vertically aligned with (e.g., may vertically overlap with) the channel region CH and the gate electrode GA.

The source SR and the drain DR may be electrically connected to and in contact with both sides of the channel region CH. The channel region CH, the source SR, and the drain DR may be provided in a substrate 110. As shown in FIG. 1, the channel region CH may be a protruding structure of the substrate 110 and/or a portion of the substrate 110 that is located between the source SR and the drain DR and/or an undoped region of the substrate 110 that is between doped regions of the substrate 110 that comprise the source SR and the drain DR. In some example embodiments, the substrate 110 may be considered to refer to portions of the substrate 110 that exclude the channel region CH, source, SR, and drain DR which are part of the domain switching device 100, and such portions of the substrate 110 may, in some example embodiments, be separate from the domain switching device 100.

As shown in at least FIG. 1, the source SR and the drain DR may be formed by injecting a dopant into two regions that are apart from each other in the substrate 110, and an area of the substrate 110 between the source SR and the drain DR may be defined to be the channel region CH. Restated, the source SR and drain DR may be two separate, doped regions of the substrate 110 that are isolated from contact with each other by an interposing region of the substrate 110 that defines the channel region CH. The substrate 110 may include, for example, a Si substrate, or a substrate including a material other than Si, for example, Ge, SiGe, a Group III-V semiconductor, any combination thereof, or the like. In this case, the channel region CH may include Si, Ge, SiGe, or a Group III-V semiconductor. The material of the substrate 110 is not limited to the above description and may be changed in various ways. Furthermore, the channel region CH may be formed as a material layer separated from the substrate 110, not as a part of the substrate 110. Additionally, the source SR and the drain DR may be formed as separate material layers separated from the substrate 110, not as part of the substrate 110. The material of the channel region CH may include at least one of Si, Ge, SiGe, a Group III-V semiconductor, an oxide semiconductor, a nitride semiconductor, an oxynitride semiconductor, a two-dimensional (2D) material, a transition metal dichalcogenide, a quantum dot, a transition metal dichalcogenide, or an organic semiconductor. The oxide semiconductor may include, for example, InGaZnO any combination thereof, or the like. The 2D material may include, for example, transition metal dichalcogenide (TMD) or graphene. The quantum dot may include a colloidal quantum dot (colloidal QD), a nanocrystal structure, any combination thereof, or the like. These are examples, and the present disclosure is not limited thereto.

The gate electrode GA is disposed apart from, and to face, the channel region CH. The anti-ferroelectric layer 140, which is a domain switching layer as described herein, may be provided between the channel region CH and the gate electrode GA. The gate electrode GA may include at least one of metal. e.g., e.g., Pt, Ru, Au, Ag, Mo, Al, W, Cu, or the like, an alloy, a conductive metal oxide, or a conductive metal nitride. It will be understood that an element described to be "disposed apart from" another element may be described as being "isolated from contact with" the other element, e.g., by one or more interposing structures and/or spaces.

The anti-ferroelectric layer 140 may include at least one of HfO, ZrO, SiO, AlO, CeO, YO, or LaO, and may further include a dopant such as at least one of Si, Al, Zr, Y, La, Gd, Sr, Hf, or Ce in addition thereto. The example materials exhibit ferroelectricity or anti-ferroelectricity according to a stress state at an interface between a crystalline phase and/or an adjacent layer. In the domain switching device 100 according to some example embodiments, the anti-ferroelectric layer 140 is provided in an interface stress controlled state to allow the materials to exhibit anti-ferroelectricity.

For example, HfO-based ferroelectric characteristics are due to the crystalline phase of a material, and it is known that anti-ferroelectric characteristics appear in a tetragonal phase and ferroelectric characteristics appear in an orthorhombic phase. Accordingly, after an amorphous HfO thin film is deposited, anti-ferroelectricity is obtained through annealing and stress control.

A comparison between anti-ferroelectricity and ferroelectricity is described below.

A ferroelectric material has a spontaneous electric dipole, that is, spontaneous polarization, as a charge distribution in a unit cell in a crystalline material structure is non-centrosymmetric. The ferroelectric material has remnant polarization by the electric dipole even when there is no external electric field, and a polarization direction may also be switched by an external electric field in units of domains.

An anti-ferroelectric material includes a ferroelectric domain in which electric dipoles are arranged, but a remnant polarization value is 0 or close to 0 in a state when no external electric field is applied. In other words, the anti-ferroelectric material, when no electric field is applied, ideally has the same rate of electric dipoles having opposite polarization directions and thus the remnant polarization value is 0 or close to 0. In the anti-ferroelectric material, the direction of polarization may be switched when an external electric field is applied thereto.

The anti-ferroelectric layer 140 may substantially have non-hysteresis behavior characteristics when polarization changes according to the external electric field. In other words, during a domain switching operation, the anti-ferroelectric layer 140 may not have or may not substantially have hysteresis characteristics.

In the domain switching device 100 according to some example embodiments, materials capable of exhibiting ferroelectricity or anti-ferroelectricity are used and to allow anti-ferroelectricity to be expressed to the materials, the anti-ferroelectric layer 140 may be implemented by controlling interface stress and/or crystalline phase.

The domain switching device 100 according to some example embodiments is provided with (e.g., includes) the conductive layer 150, which may be between the gate electrode GA and the anti-ferroelectric layer 140, and which may be in contact with the anti-ferroelectric layer 140, as a seed layer to apply tensile stress to the anti-ferroelectric layer 140 and induce anti-ferroelectricity.

The conductive layer 150 has conductivity and may include a material having a surface resistance less than about 1 MΩ/square. The conductive layer 150 may include a material having a thermal expansion coefficient that is less (e.g., smaller) than a thermal expansion coefficient of the material used for the anti-ferroelectric layer 140, to apply tensile stress to the anti-ferroelectric layer 140 in a high-temperature annealing process and a cooling process during the manufacture of the domain switching device 100. Accordingly, in some example embodiments, the thermal expansion coefficient of the conductive layer 150 may be smaller than a thermal expansion coefficient of the anti-ferroelectric layer 140. As the material of the conductive layer 150, a material may be selected which has a thermal expansion coefficient by which the tensile stress applied to the anti-ferroelectric layer 140 in the cooling process after the annealing process is within a certain range. In other words, the material of the conductive layer 150 may be selected such that a difference in the thermal expansion coefficient between the material of the conductive layer 150 and the material used for the anti-ferroelectric layer 140 is less than a difference in the thermal expansion coefficient at which ferroelectricity is induced. For example, the material of the conductive layer 150 may be selected such that the thermal expansion coefficient of the conductive layer 150 is greater or less than the thermal expansion coefficient of the material used for the anti-ferroelectric layer 140 and greater than the thermal expansion coefficient of Mo. In some example embodiments, the thermal expansion coefficient of the conductive layer 150 may be greater than the a thermal expansion coefficient of Mo. The thermal expansion coefficient difference of the material of the conductive layer 150 may have a range of about $4\times10^{-6}$/K to about $20\times10^{-6}$/K.

The conductive layer 150 may include a metal nitride, a metal oxynitride, RuO, MoO, or WO.

At least a partial area of the anti-ferroelectric layer 140, which is adjacent to (e.g., in contact with) the conductive layer 150, may be in a crystallized state and may include tetragonal crystal. For example, as shown in FIG. 1, the anti-ferroelectric layer 140 may comprise a first portion 140-1 and a second portion 140-2, where the first portion 140-1 is a portion of the anti-ferroelectric layer 140 that is crystalized. The first portion 140-1 may be a limited portion of the anti-ferroelectric layer 140, such that the second portion 140-2 comprises a remainder of the anti-ferroelectric layer 140. The second portion 140-2 may be un-crystalized. In some example embodiments, all of the anti-ferroelectric layer 140 is crystalized, such that the first portion 140-1 comprises the entirety of the anti-ferroelectric layer 140 and the second portion 140-2 is absent from the anti-ferroelectric layer 140.

As shown, the first portion 140-1 may be adjacent to (e.g., in contact with) the conductive layer 150. As shown, the second portion 140-2 may be isolated from contact with the conductive layer 150 by the first portion 140-1. As further shown, the second portion 140-2 may be in contact with the barrier layer 130, and the first portion 140-1 may be isolated from contact with the conductive layer 150 by the second portion 140-2.

In some example embodiments, a portion of both the first portion 140-1 and the second portion 140-2 may be in contact with the conductive layer 150, such that the first portion 140-1 that is crystallized defines at least a portion of the surface area (e.g., a limited portion of the surface area or all of the surface area) of a top surface 140a of the anti-ferroelectric layer 140 that is in contact with the conductive layer 150, such that some or all of the surface area of the top surface 140a of the anti-ferroelectric layer 140 that is in contact with the conductive layer 150 is the crystalized first portion 140-1. In some example embodiments, a portion of both the first portion 140-1 and the second portion 140-2 may each define a separate portion of the surface area of the top surface 140a that is in contact with the conductive layer 150.

The anti-ferroelectric layer 140 may have ZrO at a ratio of over 50% in an interface area with the conductive layer 150 (e.g., a surface area of the top surface 140a of the anti-ferroelectric layer 140 that is in contact with the conductive layer 150). Restated, in some example embodiments, the anti-ferroelectric layer 140 may include ZrO at a ratio of greater than 50% in the surface area of the top surface 140a of the anti-ferroelectric layer 140 that is in contact with the conductive layer 150.

It will be understood that a portion of the top surface 140a that is in contact with the conductive layer 150 may be referred to herein as an interface with the conductive layer 150, and the surface area of said portion of the top surface 140a that is in contact with the conductive layer 150 may be referred to as an interface area of an interface of the anti-ferroelectric layer 140 with the conductive layer 150. Where an entirety of the top surface 140a is in contact with the conductive layer 150, for example as shown in FIG. 1, the surface area of the top surface 140a may be the same as the interface area of the interface with the conductive layer 150.

The barrier layer 130 may be disposed between the channel region CH and the anti-ferroelectric layer 140. The barrier layer 130 may be disposed adjacent to the anti-ferroelectric layer 140.

The barrier layer 130 is an insulating layer restricting and preventing electrical leakage and may include a silicon oxide (SiO), an aluminum oxide (AlO), a hafnium oxide (HfO), a zirconium oxide (ZrO), a 2D insulator, any combination thereof, or the like. A material such as hexagonal boron nitride (h-BN) may be used for the 2D insulator. However, the material of the barrier layer 130 is not limited thereto.

As a dielectric constant of the barrier layer 130 increases, it is advantageous for improving the performance of the domain switching device 100. The barrier layer 130 may include a material having a breakdown voltage greater than the breakdown voltage of the anti-ferroelectric layer 140.

As the domain switching device 100 according to some example embodiments has negative capacitance and employs, as the domain switching layer, the anti-ferroelectric layer 140 having substantially no or hardly hysteresis with respect to a polarization change according to an electric field, the operating voltage may be lowered, and accordingly it is advantageous for scaling down of a device, including an electronic device that includes the domain switching device 100.

Figure 2:
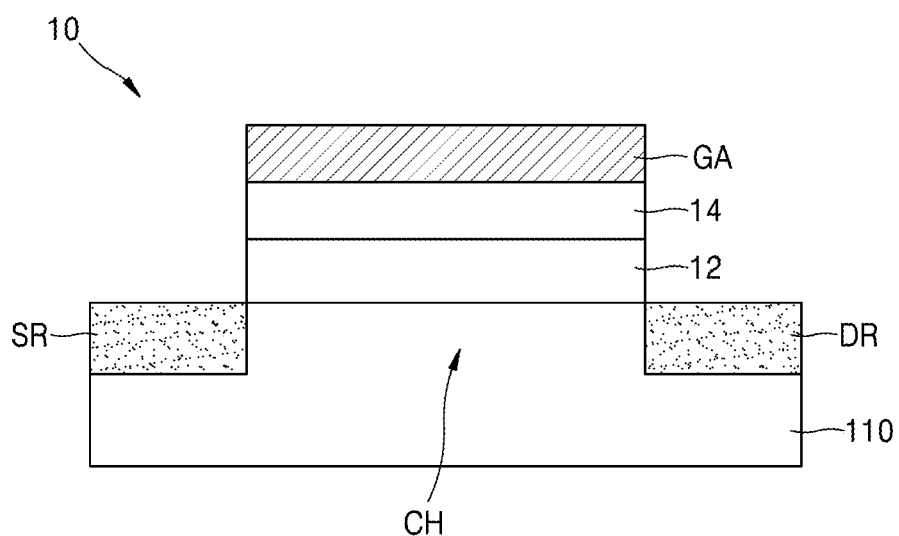
FIG. 2 is a schematic cross-sectional view of a domain switching device according to some example embodiments.
Figure 3A:
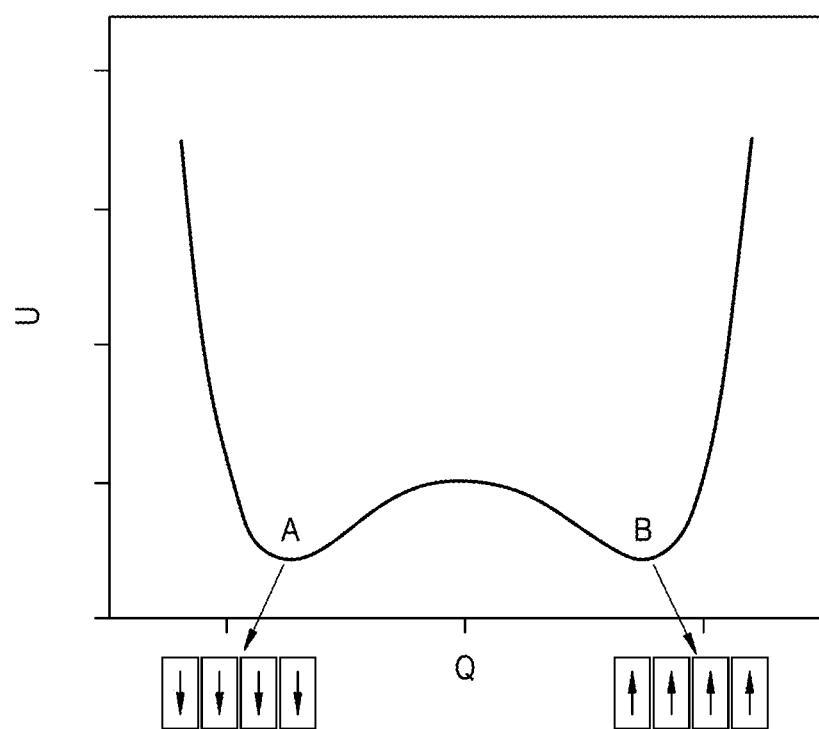
FIGS. 3A and 3B are conceptual graphs respectively showing a relationship between charges and energy and a relationship between an electric field and polarization of a ferroelectric material employed in a domain switching device according to some example embodiments.
Figure 3B:
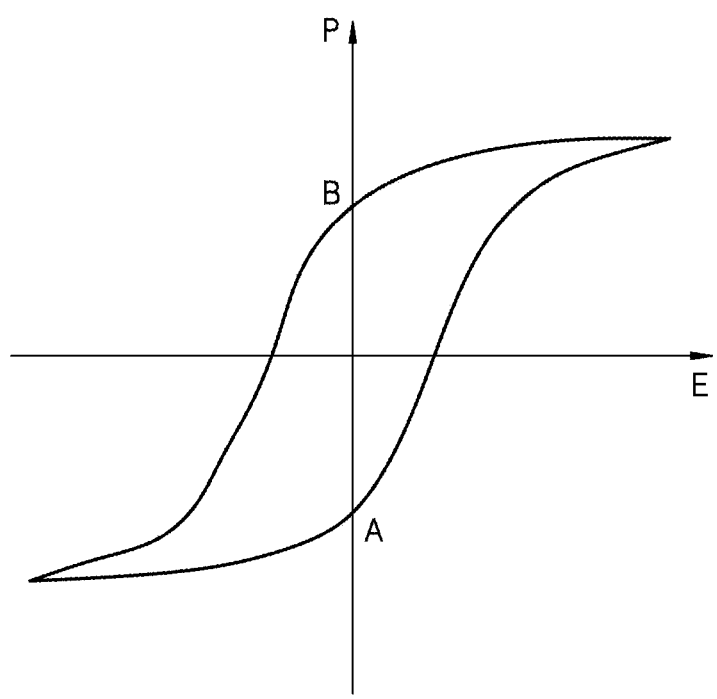
Figure 4A:
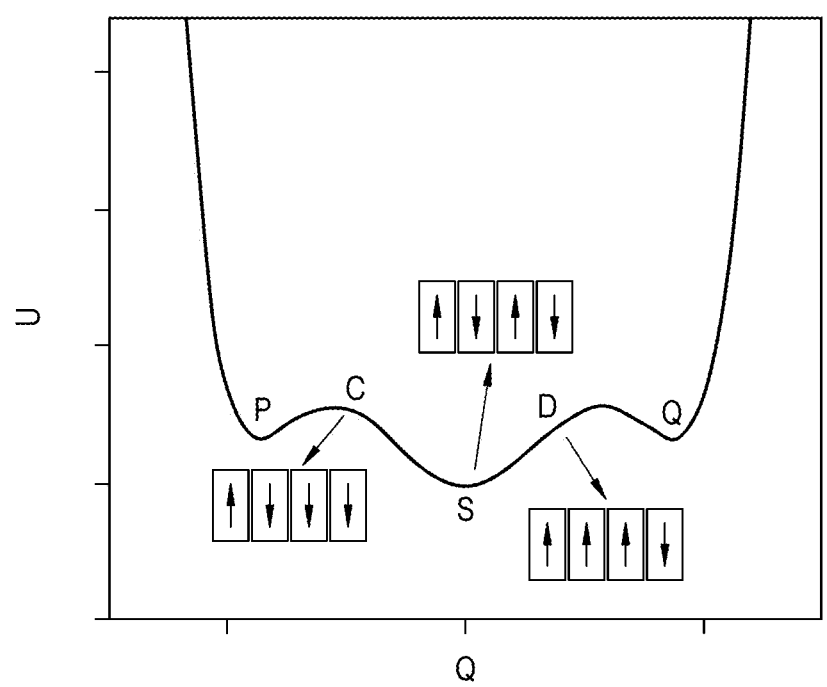
FIGS. 4A and 4B are conceptual graphs respectively showing a relationship between charges and energy and a relationship between an electric field and polarization of an anti-ferroelectric material employed in a domain switching device according to some example embodiments.
Figure 4B:
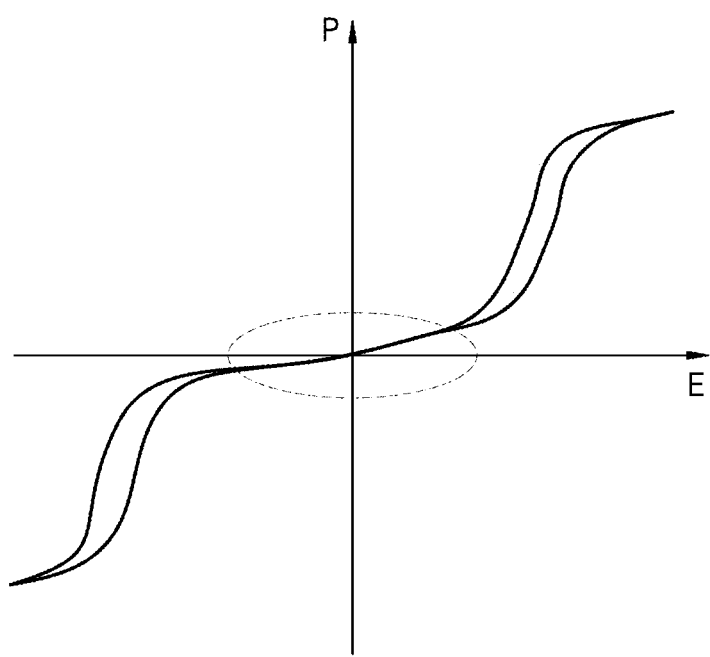

FIG. 2 is a schematic cross-sectional view of a domain switching device 10 according to some example embodiments. FIGS. 3A and 3B are conceptual graphs respectively showing a relationship between charges and energy and a relationship between an electric field and polarization of a ferroelectric material employed in a domain switching device according to some example embodiments. FIGS. 4A and 4B are conceptual graphs respectively showing a relationship between charges and energy and a relationship between an electric field and polarization of an anti-ferroelectric material employed in a domain switching device according to some example embodiments.

The domain switching device 10 according to some example embodiments may include the channel region CH, the source SR and the drain DR which are connected to the channel region CH, the gate electrode GA disposed apart from the channel region CH, and a ferroelectric layer 14 and a dielectric layer 12 disposed between the gate electrode GA and the channel region CH.

The domain switching device 10 according to some example embodiments, including the example embodiments shown in FIG. 2, which employs the ferroelectric layer 14 as a domain switching layer, is different from the domain switching device 100 according to some example embodiments, including the example embodiments illustrated in FIG. 1, which employs the anti-ferroelectric layer 140 as a domain switching layer.

Both of the ferroelectric material and the anti-ferroelectric material adopted in each of the domain switching device 10 according to some example embodiments, including the example embodiments shown in FIG. 2, and the domain switching device 100 according to some example embodiments, including the example embodiments shown in FIG. 1, have a ferroelectric domain and may exhibit negative capacitance. Capacitance is an index indicating the ability of a material to store electrical charges. Actually, general capacitors in most electronic devices store charges when a voltage is applied to the capacitor. In contrast, negative capacitance signifies a feature that, as an applied voltage increases, storing of charges decreases. The characteristics may be explained to be inversion of electric dipoles due to the applied voltage. The negative capacitance is a unique reaction of charges to the applied voltage. When a material having such characteristics is well adapted to a transistor, power consumed by the transistor or an apparatus including the transistor may be significantly reduced, thereby improving performance and/or operating efficiency (e.g., improving power consumption efficiency).

In the domain switching device 10 having a structure as shown in some example embodiments, including the example embodiments shown in FIG. 2, the performance may be restricted by the hysteresis of the ferroelectric layer 14.

FIG. 3A illustrates an example of a relationship between charge Q and energy U of a ferroelectric material and a polarization distribution of a dipole domain in two energy states.

Referring to FIG. 3A, a ferroelectric material has two degenerate states in which polarization directions are all in a down direction or in an up direction. When the charge Q is 0, these two states are mixed half and half due to formation of a multi-domain, and the direction of net polarization is up or down according to the direction of an applied electric field, thereby remaining in a state A or B after the applied electric field disappears. Then, a polarization change with respect to the applied electric field has hysteresis depending on the state A or B.

The graph of FIG. 3B shows a relationship between an electric field E and a polarization P. Referring to the graph, according to whether the polarization P is in a state (A, B) when there is no applied electric field, the polarization P according to the electric field E applied thereafter has hysteresis having a different value.

In contrast, for the anti-ferroelectric material, such a hysteresis hardly appears.

Referring to a charge Q-energy U graph of FIG. 4A, an up polarization direction and a down polarization direction are repeatedly arranged and a state S in which net polarization is 0 becomes the most stable state. In this state, when an external electric field is applied, a domain is switched and becomes, for example, a state C or D having more dipoles in any one direction. In this state, when the applied electric field disappears, the state S resumes in which the polarization directions are repeatedly arranged up and down. The polarization P by the electric field E applied thereafter has the same tendency of change as before and does not have hysteresis. Such a tendency is maintained within a range in which the applied electric field is small, for example, the state change by the applied electric field does not become the state P or Q on the graph of FIG. 4A.

The graph of FIG. 4B shows a relationship between the electric field E and the polarization P. Referring to the graph, when the value of an applied electric field is within a certain range, for example, in a range of an area indicated by a dashed circle, the polarization P by the electric field E has a constant tendency without hysteresis.

As such, the ferroelectric material may have a negative capacitance effect due to the domain switching in a situation without hysteresis.

Figure 5:
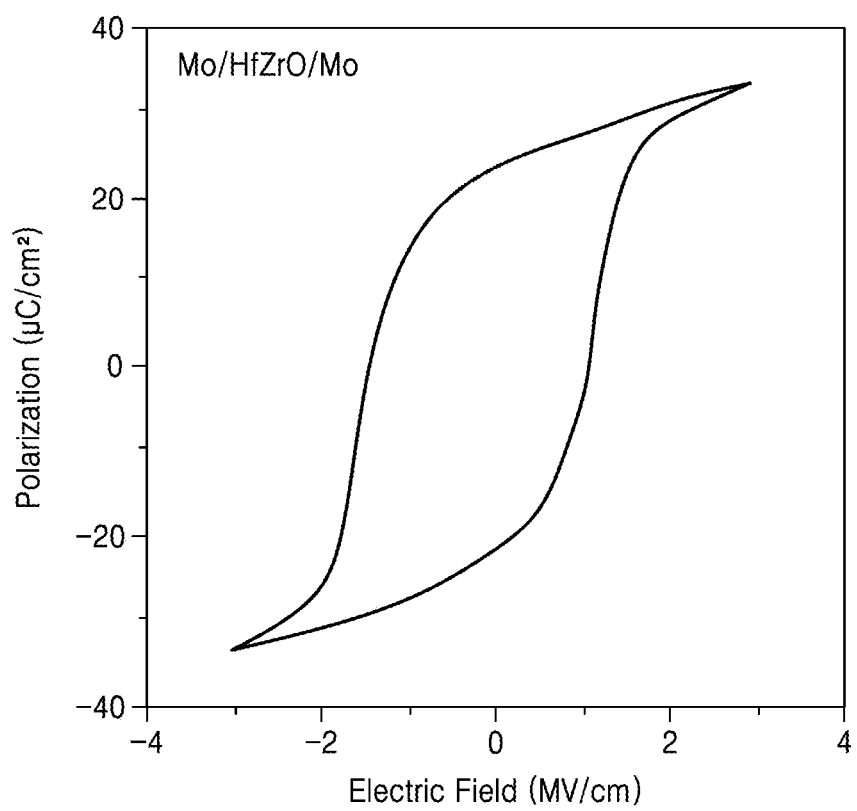
FIGS. 5 and 6 are experimentally confirmed graphs respectively showing that HfZrO is capable of exhibiting ferroelectricity and anti-ferroelectricity by an interfacial strain relationship with an adjacent material layer according to some example embodiments.
Figure 6:
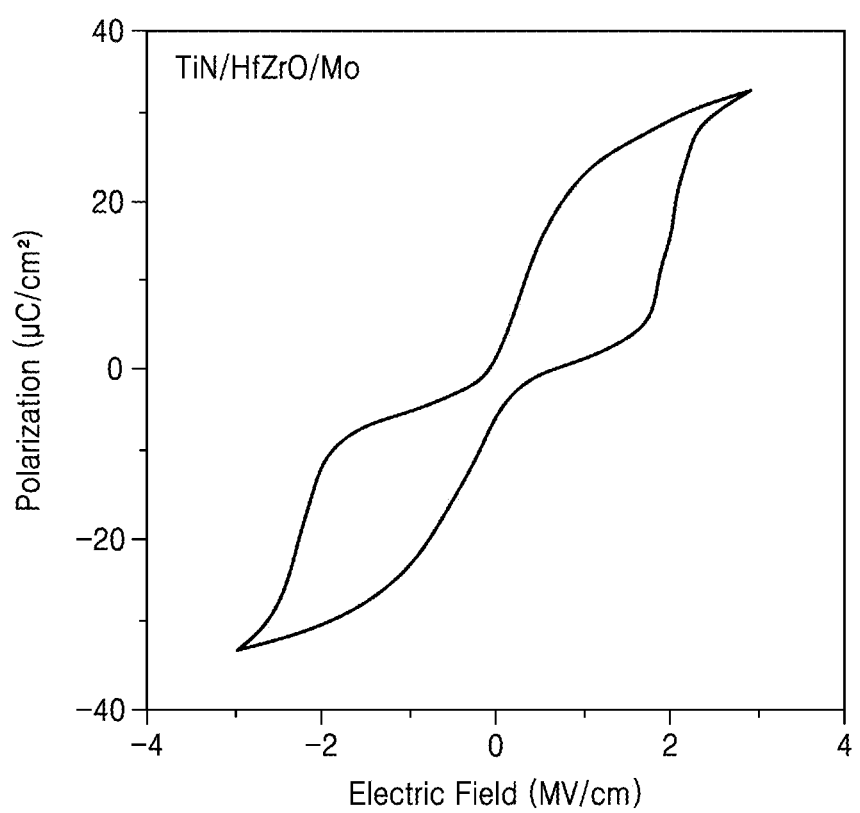

FIGS. 5 and 6 are experimentally confirmed graphs respectively showing that HfZrO is capable of exhibiting ferroelectricity and anti-ferroelectricity by an interfacial strain relationship with an adjacent material layer according to some example embodiments.

A laminated film used in the experiment of FIG. 5 has a lamination structure of Mo/HfZrO/Mo in order from the top. In the lamination structure, an electric field-polarization graph by a HfZrO thin film shows a distinct hysteresis, and it may be seen that HfZrO is ferroelectric.

A laminated film used in the experiment of FIG. 6 has a lamination structure of TiN/HfZrO/Mo in order from the top. In the lamination structure, an electric field-polarization graph by a HfZrO film shows a hysteresis that is distinctively reduced compared to FIG. 5. In particular, such a tendency is clearly shown in a range where an applied electric field is small. It may be seen that a ferroelectric phase and an anti-ferroelectric phase exist together in HfZrO having the lamination structure, from which HfZrO exhibits anti-ferroelectricity in a structure of TiN/HfZrO/Mo.

Such a tendency may be analyzed due to stress applied to HfZrO by an adjacent layer to HfZrO, that is, due to a thermal expansion coefficient difference between TiN and HfZrO and a thermal expansion coefficient difference between Mo and HfZrO.

Both TiN and Mo have a thermal expansion coefficient less than a thermal expansion coefficient of HfZrO, and thus, when cooled after the high-temperature annealing process, tensile stress is applied to HfZrO. TiN has a thermal expansion coefficient greater than the thermal expansion coefficient of Mo. Accordingly, a thermal expansion coefficient difference between HfZrO and TiN is less than a thermal expansion coefficient difference between HfZrO and Mo. In other words, during cooling after annealing, the tensile stress applied to HfZrO in the structure of TiN/HfZrO/Mo is less than the tensile stress applied to HfZrO in the structure of Mo/HfZrO/Mo.

A Hf oxide or a Zr oxide has been known to exhibit ferroelectricity in an orthorhombic crystalline phase and anti-ferroelectricity in a tetragonal crystalline phase. Accordingly, it may be analyzed from the experiment result that HfZrO exhibits ferroelectricity as an orthorhombic crystalline phase is formed in a relatively large tensile stress state and exhibits anti-ferroelectricity/ferroelectricity as a tetragonal/orthorhombic crystalline phase is formed in a relatively small tensile stress state. In other words, HfZrO may exhibit anti-ferroelectricity by appropriately controlling tensile stress with respect to an adjacent layer.

As described above, the domain switching device 100 according to some example embodiments includes the conductive layer 150 as a seed layer for inducing anti-ferroelectricity and controlling stress, and anti-ferroelectricity may be implemented by selecting the material of the conductive layer 150 such that the thermal expansion coefficient of the conductive layer 150 is appropriately set in a relationship with the thermal expansion coefficient of a material forming the anti-ferroelectric layer 140.

Figure 7:
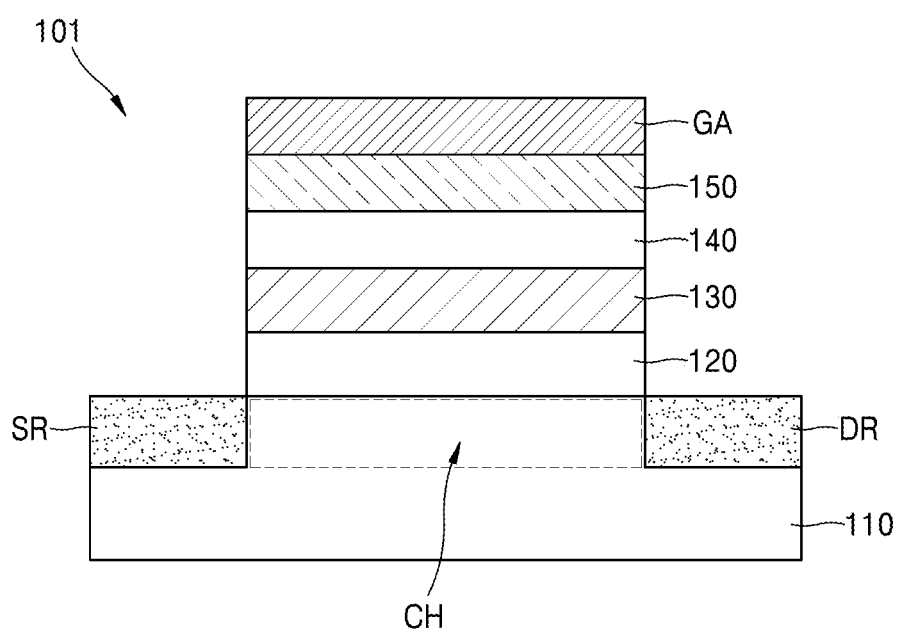
FIG. 7 is a schematic cross-sectional view of a domain switching device according to some example embodiments.

FIG. 7 is a schematic cross-sectional view of a domain switching device 101 according to some example embodiments.

Referring to FIG. 7, the domain switching device 101 may include the channel region CH, the source SR and the drain DR which are connected to the channel region CH (e.g., in contact with the channel region CH), the gate electrode GA disposed apart from the channel region CH, and the conductive layer 150, the anti-ferroelectric layer 140, and the barrier layer 130, which are disposed between the gate electrode GA and the channel region CH. Furthermore, a dielectric layer 120 is provided between the barrier layer 130 and the channel region CH. As shown in FIG. 7, the dielectric layer 120 may be in contact, at opposite surfaces, with the barrier layer 130 and the channel region CH.

The dielectric layer 120 is an insulating layer restricting or preventing electrical leakage with the barrier layer 130. The dielectric layer 120 may include a material different from the material of the barrier layer 130. Restated, a total material composition of the dielectric layer 120 may be different from the total material composition of the barrier layer 130. The dielectric layer 120 may have a dielectric constant less than the dielectric constant of the barrier layer 130. Restated, a dielectric constant of the barrier layer 130 may be greater than a dielectric constant of the dielectric layer 120. The dielectric layer 120 may include SiO, AlO, HfO, ZrO, or a 2D insulator. A material such as hexagonal boron nitride (h-BN) may be used for the 2D insulator. However, the material of the dielectric layer 120 is not limited thereto.

FIGS. 8A, 8B, 8C, 8D, 8E, 8F, and 8G are cross-sectional views of a method of manufacturing a domain switching device, according to some example embodiments. The method shown in FIGS. 8A-8G may be implemented, in some example embodiments, by a system for manufacturing at least a domain switching device, including at least the system 1301 shown in FIG. 11 and/or the system 5000 shown in FIG. 12.

Figure 8A:
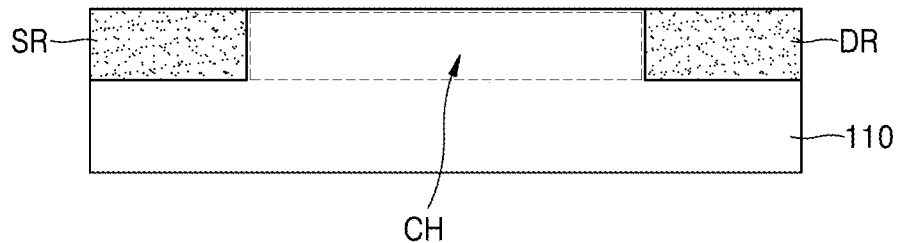
FIGS. 8A, 8B, 8C, 8D, 8E, 8F, and 8G are cross-sectional views of a method of manufacturing a domain switching device, according to some example embodiments.

Referring to FIG. 8A, the substrate 110 including the channel region CH is provided (e.g., the substrate 110 is prepared), which may include causing the channel region CH to be formed to cause the substrate 110 to include the channel region CH.

The channel region CH may include at least one of Si, Ge, SiGe, a Group III-V semiconductor, an oxide semiconductor, a nitride semiconductor, an oxynitride semiconductor, a 2D material, transition metal dichalcogenide, a quantum dot, or an organic semiconductor.

Figure 8B:
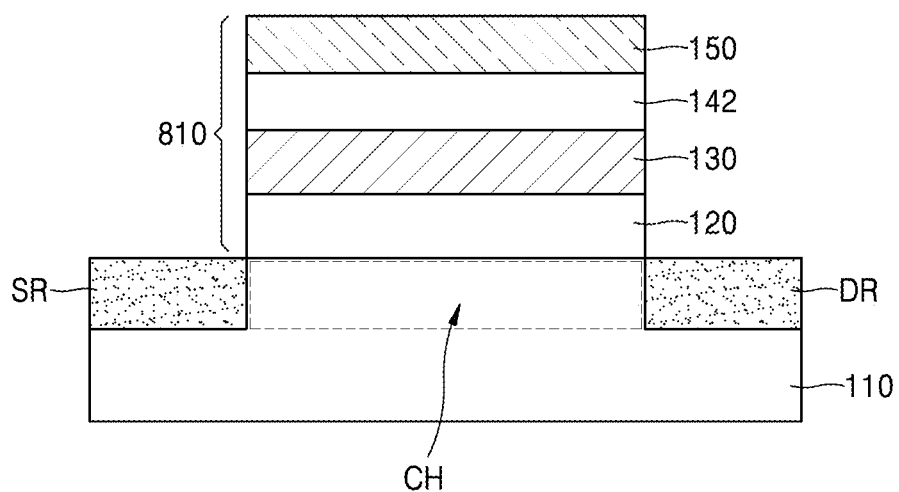

The source SR and the drain DR may be formed by injecting a dopant into two separate regions that are apart from each other on the substrate 110, and an area of the substrate 110 between the source SR and the drain DR may be defined to be the channel region CH. The dopants injected into the separate regions to form the source SR and the drain DR may be the same dopant material (the dopants injected into the separate regions may have the same material composition) or may be different dopant materials having different material compositions. Accordingly, in some example embodiments, preparing a substrate 110 including a channel region CH may include injecting the dopants to form the source SR and the drain DR into the two separate regions of the substrate 110 that are isolated from contact with each other to thus define the channel region CH as a region external to and between the source STR and the drain DR in the substrate 110. Such preparation shown in FIG. 8A may be implemented prior to forming a lamination structure 810 on the substrate 110 (e.g., on the channel region CH), as shown in FIG. 8B. The source SR and the drain DR may be formed in this operation, but the present disclosure is not limited thereto, and the source SR and the drain DR may be formed in any subsequent operations. In some example embodiments, the operation of preparing the substrate 110 as shown in FIG. 8A may be performed externally to a system that performs the remaining operations of the method shown in FIGS. 8A-8G, such that a pre-prepared substrate 110 having at least the channel region CH (and, in some example embodiments, further including the source SR and/or drain DR) may be provided to, e.g., system 1301 so that the system 1301 may cause the remaining operations of the method shown in FIGS. 8B-8G to be performed to form the domain switching device 102. In some example embodiments, the operation of preparing the substrate 110 as shown in FIG. 8A may be performed by one or more portions of the system that performs the remaining operations of the method shown in FIGS. 8A-8G (e.g., system 1301 may perform the operation of preparing the substrate 110 shown in FIG. 8A while the substrate 110 is within the process chamber 3020 and supported on the chuck 3022 therein, for example based on electronic device 3010 controlling one or more control devices 3032-1 to 3032-N to inject the dopants into the two separate regions of the substrate 110 that are isolated from contact with each other to form the source SR and drain DR and thus form the channel region CH as the region in the substrate 110 that is defined between the source SR and drain DR).

Referring to FIG. 8B, a lamination structure 810 including a domain switching layer 142 and the conductive layer 150 is formed on a channel region CH. The lamination structure 810 may include the dielectric layer 120, the barrier layer 130, the domain switching layer 142, and the conductive layer 150. However, the present disclosure is not limited thereto, and the dielectric layer 120 may be omitted from the lamination structure 810.

The domain switching layer 142 may include, as an amorphous thin film layer, at least one of HfO, ZrO, SiO, AlO, CeO, YO, or LaO, and furthermore, a dopant such as Si, Al, Zr, Y, La, Gd, Sr, Hf, or Ce may be further doped to anyone thereof.

The conductive layer 150 may contact a domain switching layer 142 and include a metal nitride, a metal oxynitride, RuO, MoO, or WO.

The material of the conductive layer 150 may be selected such that certain tensile stress is applied to the domain switching layer 142 in a cooling process after annealing, and also, the applied tensile stress is within a certain range. For example, the material of the conductive layer 150 may be selected such that the thermal expansion coefficient of the conductive layer 150 is less than the thermal expansion coefficient of the domain switching layer 142 and greater than the thermal expansion coefficient of Mo.

The barrier layer 130 and the dielectric layer 120 may include any one of SiO, AlO, HfO, ZrO, LaO, YO, or MgO, or include a material obtained by doping a dopant in any one of SiO, AlO, HfO, ZrO, LaO, YO, or MgO, or a 2D insulator. Restated, the barrier layer 130 may include at least one of SiO, AlO, HfO, ZrO, LaO, YO, or MgO, or a material that includes a dopant in any one of SiO, AlO, HfO, ZrO, LaO, YO, MgO, or a 2D insulator. The barrier layer 130 may include a material having a dielectric constant greater than that of the dielectric layer 120.

The lamination structure 810 may be formed by a deposition process such as atomic layer deposition (ALD), chemical vapor deposition (CVD), physical vapor deposition (PVD), any combination thereof, or the like. The lamination structure 810 may be formed based on sequentially forming at least the domain switching layer 142 and the conductive layer 150, and in some example forming the dielectric layer 120 and the barrier layer 130 in addition, on the substrate 110 in the order shown in FIG. 8B (the dielectric layer 120, the barrier layer 130, the domain switching layer 142, and the conductive layer 150) based on a system (e.g., system 1301) implementing separate, sequential deposition processes to sequentially form the separate layers of the lamination structure 810.

Figure 8C:
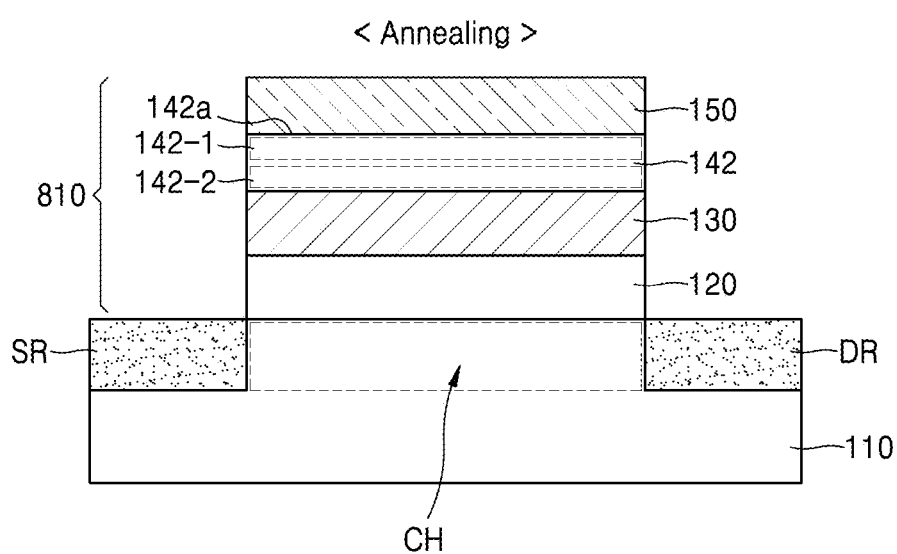

The domain switching layer 142 is an amorphous thin film layer and may, at least in FIG. 8C, be in a state of not exhibiting anti-ferroelectricity. Accordingly, an additional process of inducing anti-ferroelectricity in the domain switching layer 142 may be performed. The process may be a process of crystallizing at least a partial area (e.g., portion 142-1) of the domain switching layer 142 adjacent to the conductive layer 150, or a process of applying certain tensile stress by the conductive layer 150 to the domain switching layer 142. The process may be a process of annealing the lamination structure 810. A detailed operation therefor is described below.

Referring to FIG. 8C, an annealing process may be performed on the domain switching layer 142. The annealing temperature may be performed at a temperature in a range of about 400° C. to about 1200° C. However, the present disclosure is not limited thereto, and the annealing temperature may be set in a range in which appropriate tensile stress is applied to the domain switching layer 142 considering the materials of the domain switching layer 142 and the conductive layer 150.

Figure 8D:
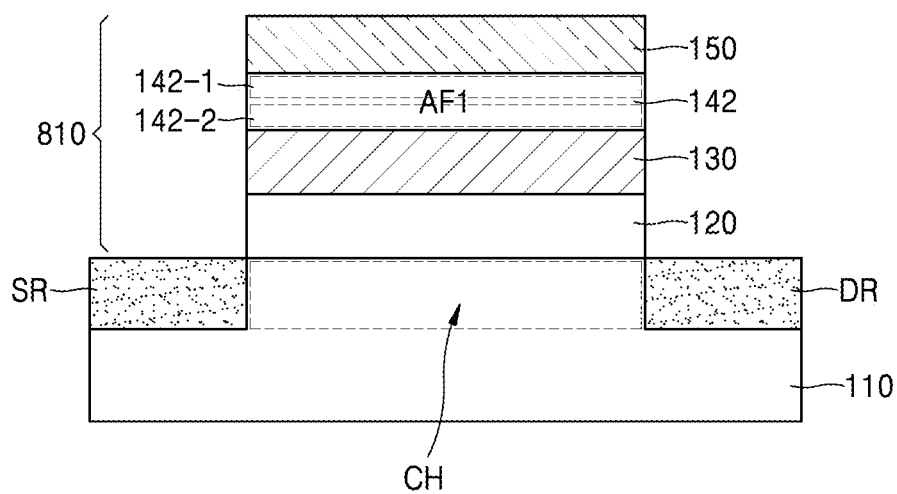

At least a partial area of the domain switching layer 142 (e.g., first portion 142-1, which may be referred to as a portion of the domain switching layer 142 and which may be a limited portion of the domain switching layer 142 that excludes a separate, second portion 142-2 of the domain switching layer 142) may be crystallized by the annealing process, and in some example embodiments, a separate partial area of the domain switching layer 142 (e.g., second portion 142-2) may be not crystalized by the annealing process. Portions 142-1 and 142-2 may correspond to the portions 140-1 and 140-2 described with reference to FIG. 1, and the descriptions of portions 140-1 and 140-2 herein may apply to portions 142-1 and 142-2, respectively. Furthermore, in the cooling process after the annealing process, certain tensile stress may be applied to the domain switching layer 142, for example the tensile stress may be applied to the domain switching layer 142 by the conductive layer 150. Through the above process, as illustrated in FIG. 8D, the domain switching layer 142 may have certain anti-ferroelectricity AF1. Accordingly, the annealing process, alone or in combination with the cooling process, as described with regard to FIG. 8C, may amount to an operation of inducing anti-ferroelectricity AF1 in at least a portion (e.g., first portion 142-1) of the domain switching layer 142. In some example embodiments, such inducing may include performing one or both of the annealing process or the application of tensile stress as described herein.

As shown, the first portion 142-1 may be adjacent to (e.g., in contact with) the conductive layer 150. As shown, the second portion 142-2 may be isolated from contact with the conductive layer 150 by the first portion 142-1. As further shown, the second portion 142-2 may be in contact with the barrier layer 130, and the first portion 142-1 may be isolated from contact with the conductive layer 150 by the second portion 142-2.

In some example embodiments, a portion of both the first portion 142-1 and the second portion 142-2 may be in contact with the conductive layer 150, such that the first portion 142-1 that is crystallized defines at least a portion of the surface area (e.g., a limited portion of the surface area or all of the surface area) of a top surface 142a of the domain switching layer 142 that is in contact with the conductive layer 150, such that some or all of the surface area of the top surface 142a of the domain switching layer 142 that is in contact with the conductive layer 150 is the crystalized first portion 142-1. In some example embodiments, a portion of both the first portion 142-1 and the second portion 142-2 may each define a separate portion of the surface area of the top surface 142a that is in contact with the conductive layer 150.

It will be understood that a portion of the top surface 142a that is in contact with the conductive layer 150 may be referred to herein as an interface with the conductive layer 150, and the surface area of said portion of the top surface 142a that is in contact with the conductive layer 150 may be referred to as an interface area of an interface of the domain switching layer 142 with the conductive layer 150. Where an entirety of the top surface 142a is in contact with the conductive layer 150, for example as shown in FIG. 1, the surface area of the top surface 142a may be the same as the interface area of the interface with the conductive layer 150.

In some example embodiments, all of the domain switching layer 142 is caused to be crystalized by the annealing and/or cooling processes to induce anti-ferroelectricity AF1 of the domain switching layer 142, such that the first portion 142-1 comprises the entirety of the domain switching layer 142 and the second portion 142-2 is absent from the domain switching layer 142.

Figure 8E:
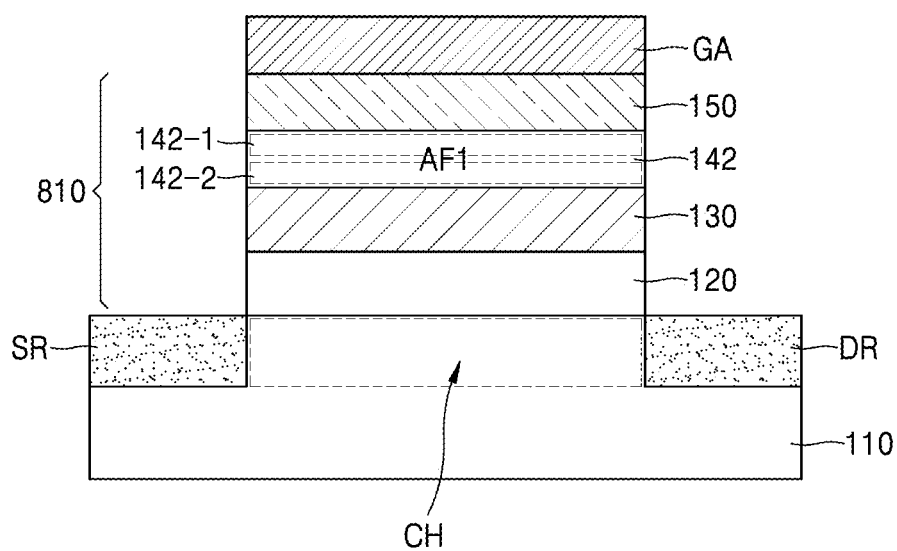

Referring to FIG. 8E, the gate electrode GA may be formed on the conductive layer 150. The gate electrode GA, which may be referred to in some example embodiments as an electrode material layer, may be formed by depositing a conductive material, and in some example embodiments the forming of the gate electrode GA may include forming an electrode material layer that includes the conductive material on the lamination structure 810. For the formation of the gate electrode GA, the conductive material may be deposited by a process, for example, ALD, CVD, or PVD, any combination thereof, or the like.

Figure 8F:
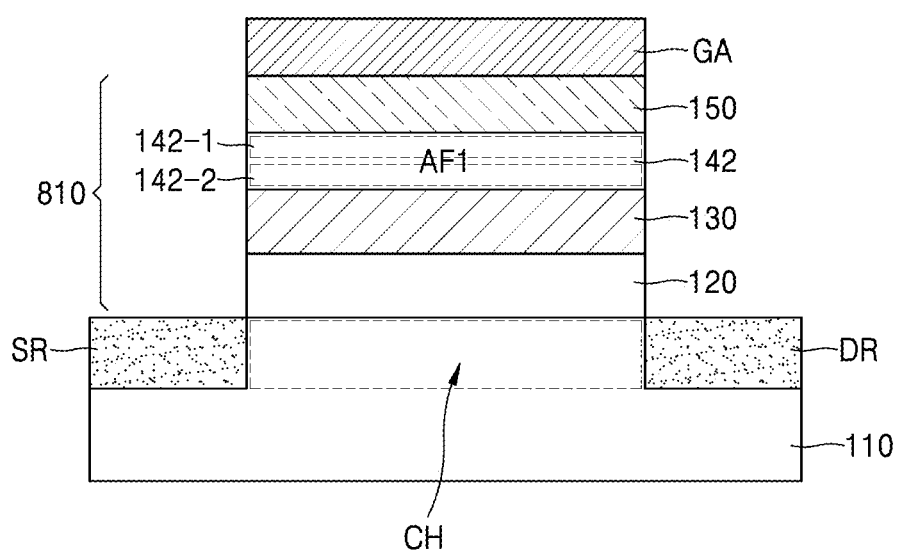

Referring to FIG. 8F, an annealing process may be performed on the domain switching layer 142. The annealing process performed when the gate electrode GA contacts the conductive layer 150 may facilitate at least partial crystallization of the domain switching layer 142. The annealing process may be performed at this operation instead of the annealing process of FIG. 8C which is omitted, or may be additionally performed after the annealing process of FIG. 8C is performed. Accordingly, the annealing process, alone or in combination with the cooling process, described with regard to FIG. 8F, may amount to an operation of inducing anti-ferroelectricity AF2 in at least a portion (e.g., first portion 142-1) of the domain switching layer 142, which may include changing the anti-ferroelectricity of at least the portion (e.g., first portion 142-1) of the domain switching layer 142 from anti-ferroelectricity AF1 to anti-ferroelectricity AF2. Accordingly, the annealing process to induct anti-ferroelectricity in the domain switching layer 142 may be performed before the gate electrode GA (e.g., electrode material layer) is formed after the lamination structure 810 is formed (e.g., the annealing process shown and described with reference to FIG. 8C) and/or after the gate electrode GA (e.g., electrode material layer) is formed (e.g., the annealing process shown and described with reference to FIG. 8F). In some example embodiments, such inducing may include performing one or both of the annealing process or the application of tensile stress as described herein with regard to FIG. 8F and/or FIG. 8C.

In some example embodiments, all of the domain switching layer 142 is caused to be crystalized by the annealing and/or cooling processes to induce anti-ferroelectricity AF2 of the domain switching layer 142, such that the first portion 142-1 comprises the entirety of the domain switching layer 142 and the second portion 142-2 is absent from the domain switching layer 142.

Figure 8G:
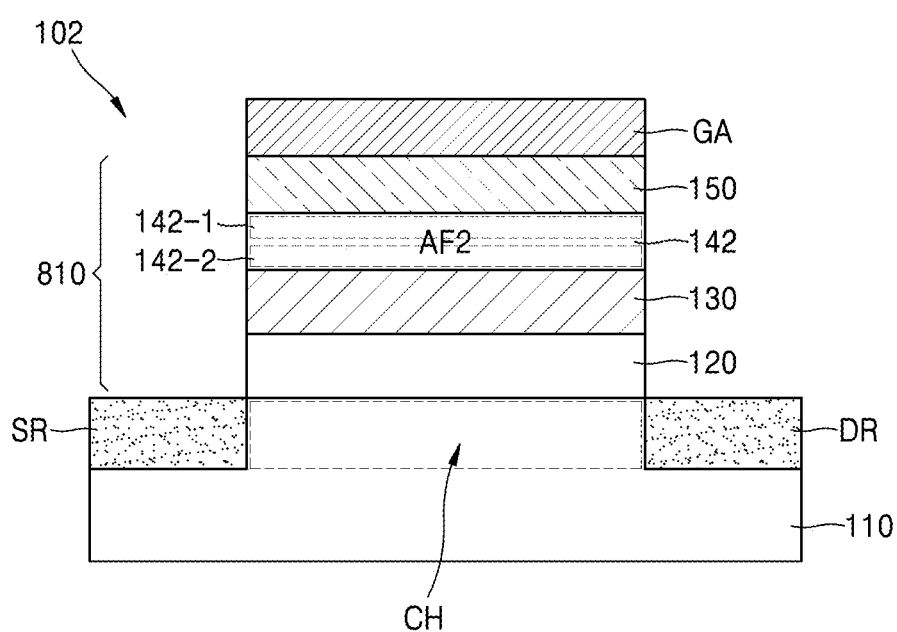

As illustrated in FIG. 8G, a domain switching device 102 including the domain switching layer 142 exhibiting certain anti-ferroelectricity AF2 may be manufactured. The domain switching device 102 may be substantially the same as the domain switching device 100 of FIG. 1 or the domain switching device 101 of FIG. 7 according to the existence of the dielectric layer 120.

A domain switching device according to some example embodiments may be applied, as a logic transistor, to various electronic devices, logic devices, any combination thereof, or the like. The logic transistor may be a basic constituent element of various electronic devices/logic devices. According to some example embodiments, as negative capacitance hardly having hysteresis is implemented, operating characteristics such as subthreshold swing SS may be improved, control efficiency may be increased, and a logic transistor advantageous for scaling down may be implemented. Accordingly, operating performing of electronic devices may be improved based on including the domain switching device according to some example embodiments. Thus, electronic devices/logic devices having superior performance may be manufactured by applying the logic transistor.

Figure 9:
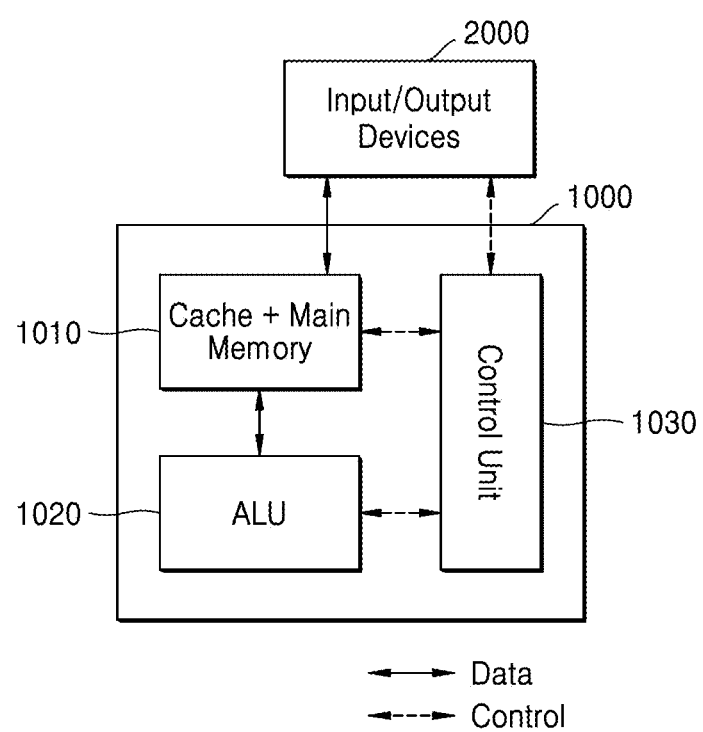
FIG. 9 is a schematic block diagram of the concept of architecture of an electronic device according to some example embodiments.

FIG. 9 is a schematic block diagram of the concept of architecture of an electronic device according to some example embodiments.

Referring to FIG. 9, a memory unit 1010 (also referred to herein as a "memory," "memory device," "storage device," or the like), an arithmetic logic unit (ALU) 1020, and a control unit 1030 (also referred to as a "controller," "control device," or the like) may be formed on one chip 1000, where chip 1000 may be referred to interchangeably herein as an electronic device 1000. The chip 1000 may be formed by monolithically depositing the memory unit 1010, the ALU 1020, and the control unit 1030 on the same substrate. Each of the ALU 1020 and the control unit 1030 may include a logic transistor that includes the domain switching device 100, 101, or 102 according to any one of the above-described example embodiments. For example, the logic transistor may include a domain switching layer exhibiting anti-ferroelectricity and having substantially non-hysteresis behavior characteristics. The memory unit 1010 may include a memory device. For example, the memory device may include a domain layer having a ferroelectric domain and hysteresis behavior characteristics. The memory unit 1010, the ALU 1020, and the control unit 1030 may be connected to one another in an on-chip metal line to directly communicate with each other. The memory unit 1010 may include both a main memory and a cache memory. The chip 1000 may be referred to as an on-chip memory processing unit. An input/output device 2000 connected to the chip 1000 may be further provided.

The electronic device may be advantageous in terms of costs because the electronic device may be manufactured by integrating the memory unit and the logic device unit on one chip. Furthermore, when the electronic device according to some example embodiments is applied to an applied field, for example, a neuromorphic device, in which the data transmission amount is large and data transmission is continuously made between the memory unit and the logic device unit, various effects such as efficiency improvement, speed improvement, reduced power consumption, any combination thereof, or the like may be obtained. As the fundamental structure and operating method of a neuromorphic device are well known, detailed descriptions thereof are omitted.

In some cases, the electronic device according to some example embodiments may be implemented as an architecture where computing unit devices and memory unit devices are formed on one chip adjacent to each other, without distinction of sub-units.

Figure 10:
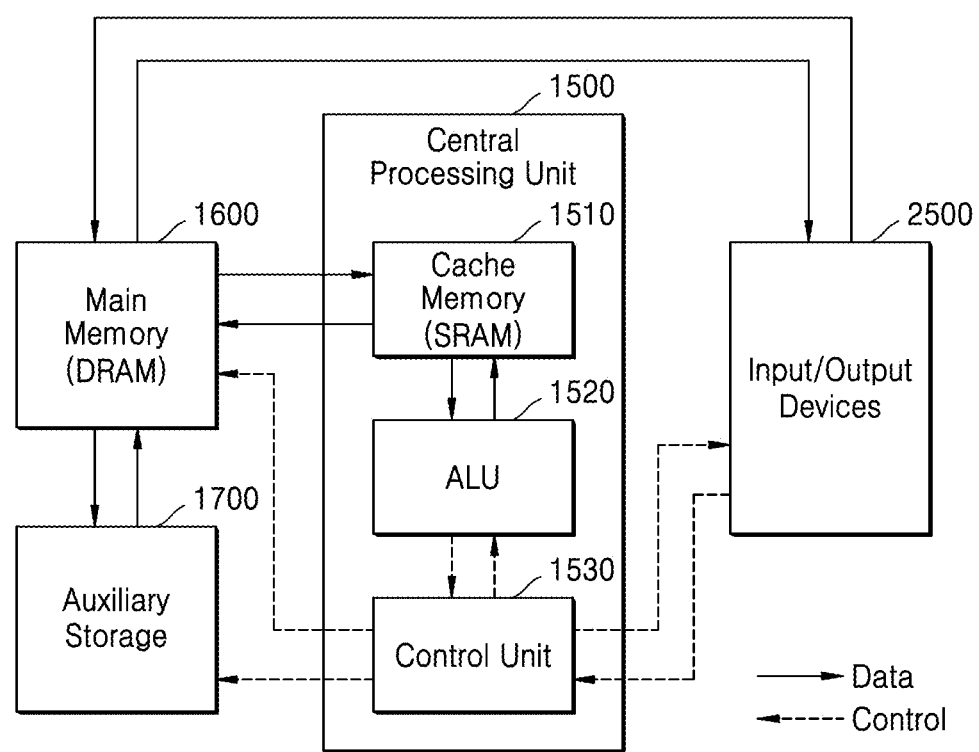
FIG. 10 is a schematic block diagram of the concept of architecture of an electronic device according to some example embodiments.

FIG. 10 is a schematic block diagram of the concept of architecture of an electronic device according to some example embodiments.

Referring to FIG. 10, a CPU chip 1500, which may be referred to interchangeably herein as an electronic device, may include a cache memory 1510, an ALU 1520, and a control unit 1530. Each of the ALU 1520 and the control unit 1530 may include a logic transistor including the domain switching device 100, 101, or 102 according to any one of the above-described example embodiments. For example, the logic transistor may include a domain switching layer exhibiting anti-ferroelectricity and having substantially non-hysteresis behavior characteristics.

A main memory 1600, an auxiliary storage 1700, and an input/output device 2500 may be provided separate from the CPU chip 1500. For example, the cache memory 1510 may be configured to be static random access memory (SRAM), and the main memory 1600 may be configured to be dynamic random access memory (DRAM).

A domain switching device having a negative capacitance effect without hysteresis may be implemented by using anti-ferroelectricity.

An anti-ferroelectric phase may be implemented in domain switching through controlling interfacial strain between the domain switching layer and the conductive layer adjacent thereto.

The domain switching device may be used as a logic transistor and may implement various electronic devices/apparatuses/circuits/systems.

It will be understood that some or all of any of the electronic devices, units, modules, or the like according to any of the example embodiments as described herein, including any of the memory unit 1010, the arithmetic logic unit (ALU) 1020, the control unit 1030, the input/output devices 2000, the main memory 1600, the auxiliary storage 1700, the central processing unit 1500, the cache memory 1510, the ALU 1520, the control unit 1530, the input/output devices 2500, any combination thereof, or the like may be included in, may include, and/or may be implemented by one or more instances of processing circuitry such as hardware including logic circuits, a hardware/software combination such as a processor executing software; or a combination thereof. For example, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the electronic devices as described herein.

Figure 11:
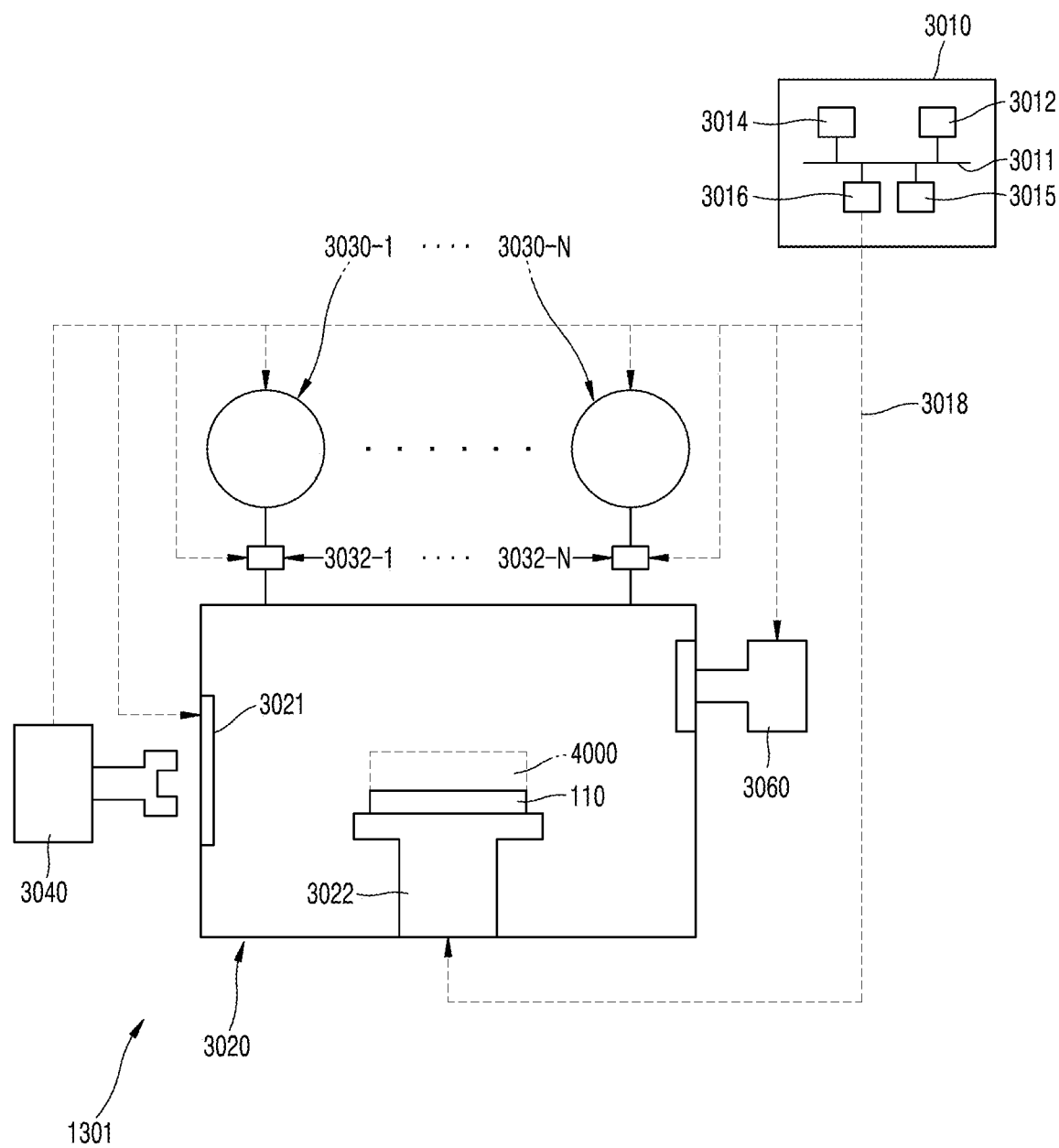
FIG. 11 shows a schematic of a system configured to control the formation of a domain switching device according to some example embodiments.

FIG. 11 shows a schematic of a system 1301 configured to control the formation of a domain switching device according to some example embodiments. As used herein, a system 1301 may be referred to as a "set."

Referring to FIG. 11, system 1301 includes an electronic device 3010 (also referred to herein interchangeably as a computing device, controlling device, controller, any combination thereof, or the like), a manipulator device 3040, a heat source 3060, composition (e.g., gas, fluid, etc.) sources 3030-1 to 3030-N (where N is a positive integer), and a process chamber 3020.

Referring first to the electronic device 3010, the electronic device 3010 may include processing circuitry 3012 (also referred to herein as simply a processor), memory 3014, a power supply 3015, and a communication interface 3016 that are communicatively and/or electrically coupled together via a bus 3011.

The electronic device 3010 may be included in one or more various electronic devices, including, for example, a mobile phone, a digital camera, a sensor device, or the like. In some example embodiments, the electronic device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like.

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

Figure 12:
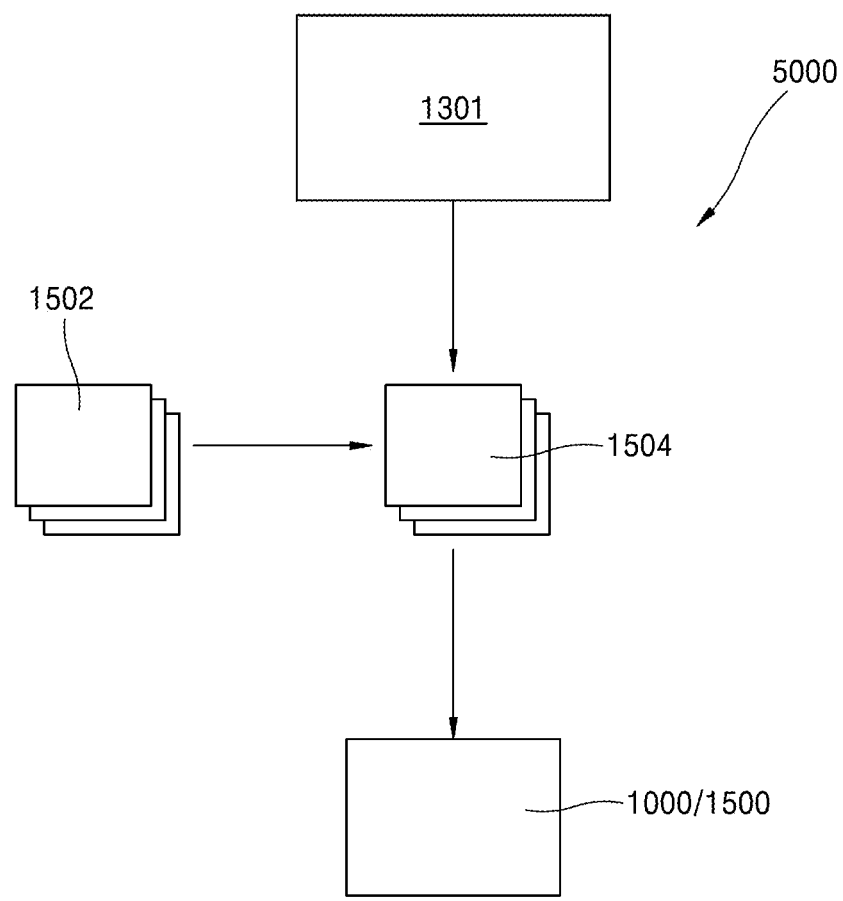
FIG. 12 shows a schematic of a system configured to control the formation of an electronic device according to some example embodiments.

The processing circuitry 3012 may execute a program and control one or more aspects of the system 1301, via the communication interface 3016 as shown in FIG. 12. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIGS. 8A-8G.

In some example embodiments, the communication interface 3016 may include a USB and/or HDMI interface. In some example embodiments, the communication interface 3016 may include a wireless communication interface.

Still referring to FIG. 11, the process chamber 3020 may be any of the process chambers described herein and may include a pedestal and/or chuck 3022 that is configured to structurally support a substrate 110 upon which the domain switching device 4000 according to any of the example embodiments may be formed. It will be understood that the domain switching device 4000 may be any of the domain switching devices according to any of the example embodiments, including any of the domain switching devices 100, 101, and/or 102. As shown, the pedestal and/or chuck 3022 may be coupled to a motor such that the electronic device 3010 may be configured to cause the pedestal and/or chuck 3022 to move, via control signals communicated from communication interface 3016, for example to enable the substrate 110 and/or domain switching device 4000 to be moved within, into, and/or out of the process chamber 3020.

Still referring to FIG. 11, system 1301 includes a manipulator device 3040 configured to manipulate thin-film structures, lamination structures, layers, and/or substrates into and/or out of a process chamber 3020, and the process chamber 3020 may include a portal 3021 (e.g., a door) via which the manipulator device 3040 may access the interior of the process chamber 3020 to provide a substrate 110 and/or to retrieve at least domain switching device 4000 formed therein. As shown, the manipulator device 3040 and the portal 3021 may be controlled by the electronic device 3010.

Still referring to FIG. 11, the system 1301 includes one or more composition sources 3030-1 to 3030-N (N being a positive integer) which may store various materials, including any of the materials used to form any of the layers of a domain switching device 4000 as described herein, any other material, dopant, and/or composition described herein, or any combination thereof, as described herein. The materials may be stored as a gas, as a liquid, as any type of fluid, or any combination thereof. As shown, each separate composition source is coupled to the process chamber 3020 via a separate supply control device 3032-1 to 3032-N (e.g., a separate control valve), where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by electronic device 3010.

Still referring to FIG. 11, system 1301 includes a heat source 3060 (e.g., an infrared heater, resistive electric heater, or the like) that may be utilized to generate heat and provide the generated heat to the process chamber 3020 (e.g., to heat at least a portion of the process chamber 3020), for example perform an annealing process as described herein. As shown, the heat source 3060 may be controlled by the electronic device 3010.

As shown in FIG. 11, the electronic device 3010 may, for example based on processing circuitry 3012 executing a program of instruction stored on memory 3014, communicate with various elements of the system 1301 via communication lines 3018 to cause the system 1301 to perform one or more portions, including performing some or all of the operations of the method shown in FIGS. 8A-8G, to form a domain switching device 4000 according to any example embodiments herein. It will be understood that the system 1301 may omit one or more of the elements shown in FIG. 11 (e.g., the heat source 3060, the pedestal or chuck 3022, or the like).

Figure 13:
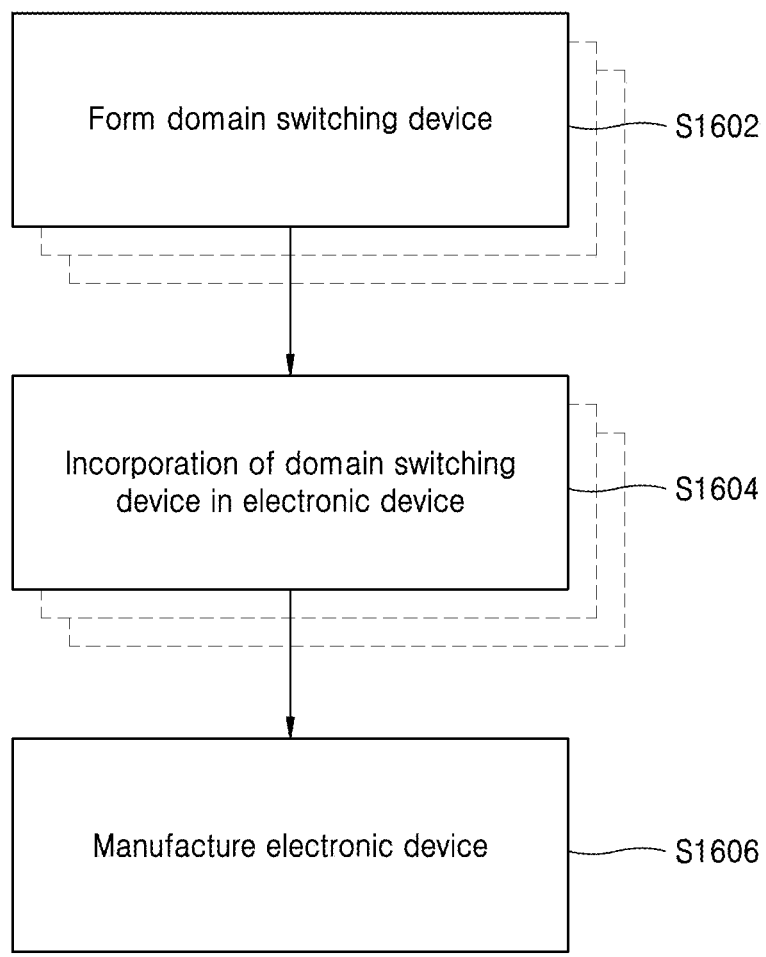
FIG. 13 is a flowchart illustrating a method implemented by a system to manufacture an electronic device according to some example embodiments.

FIG. 12 shows a schematic of a system 5000 configured to control the formation of an electronic device according to some example embodiments, and FIG. 13 is a flowchart illustrating a method implemented by the system 5000 to manufacture an electronic device according to some example embodiments. As shown, the system 5000 may include system 1301, which is configured to form a domain switching device according to any of the example embodiments of the inventive concepts (S1602). The system 5000 further includes a fabrication assembly 1504 that is configured to incorporate the domain switching device(s) 4000 formed by system 1301 with various electronic device sub-components 1502 (including, for example, printed circuit boards, power supplies, buses, communication interface components, processing circuitry components, memory components, any combination thereof, or the like). The fabrication assembly 1504 may incorporate the ferroelectric thin-film structure(s) with the sub-components 1502 (S1604) to fabricate ("manufacture") electric device components (e.g., any of electronic devices 1000, 1500, any combination thereof, or the like) and/or electronic devices themselves, to fabricate ("manufacture") electronic device(s) 1000, 1500 that include one or more domain switch devices according to any example embodiments of the inventive concepts (S1606). Such incorporation (S1604) and fabrication (S1606) may include, for example, assembling an electronic device component (e.g., any of electronic devices 1000 or 1500 as described herein, further assembling processing circuitry and/or memory based on incorporating said electronic devices to additional electronic device sub-components, etc.) based on coupling the domain switching device 4000 to one or more electronic device sub-components, and coupling the electronic device component to other electronic device components (e.g., printed circuit board, or PCB) to form the electronic device (e.g., 1000 or 1500).

Although many descriptions are presented above in detail, the scope of the present inventive concepts are not limited thereto, and the descriptions are interpreted as examples of detailed example embodiments. For example, a person skilled in the art to which the present disclosure belongs would know that the configurations of the domain switching device of FIGS. 1 to. 7 and the electronic device of FIGS. 9 and 10 may be changed in various ways. Furthermore, a person skilled in the art to which the present disclosure belongs would know that the manufacturing method of the domain switching device described with reference to FIGS.

8A to 8G may be changed in various ways. It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A domain switching device, comprising:
a channel region;
a source and a drain connected to the channel region;
a gate electrode isolated from contact with the channel region;
an anti-ferroelectric layer between the channel region and the gate electrode;
a conductive layer between the gate electrode and the anti-ferroelectric layer, the conductive layer in contact with the anti-ferroelectric layer; and
a barrier layer between the anti-ferroelectric layer and the channel region,
wherein the anti-ferroelectric layer is exhibiting anti-ferroelectric based on at least one of
a tensile stress being applied to the anti-ferroelectric layer, or
at least a portion of the anti-ferroelectric layer being crystallized.

2. The domain switching device of claim 1, wherein the anti-ferroelectric layer is configured to exhibit anti-ferroelectricity based on at least the portion of the anti-ferroelectric layer being crystallized and including a tetragonal crystal phase.

3. The domain switching device of claim 1, wherein the anti-ferroelectric layer includes ZrO at a ratio of over 50% in a surface area of a surface of the anti-ferroelectric layer that is in contact with the conductive layer and defines an interface area of an interface with the conductive layer.

4. The domain switching device of claim 1, wherein the conductive layer comprises a material having a surface resistance less than about 1 MΩ/square.

5. The domain switching device of claim 1, wherein a thermal expansion coefficient of the conductive layer is smaller than a thermal expansion coefficient of the anti-ferroelectric layer.

6. The domain switching device of claim 5, wherein the thermal expansion coefficient of the conductive layer is greater than a thermal expansion coefficient of Mo.

7. The domain switching device of claim 1, wherein the conductive layer comprises a metal nitride, a metal oxynitride, RuO, MoO, or WO.

8. The domain switching device of claim 1, wherein the barrier layer has a breakdown voltage greater than a breakdown voltage of the anti-ferroelectric layer.

9. The domain switching device of claim 1, wherein the barrier layer comprises:
at least one of SiO, AlO, HfO, ZrO, LaO, YO, or MgO, or
a material including a dopant in any one of SiO, AlO, HfO, ZrO, LaO, YO, MgO, or a 2D insulator.

10. The domain switching device of claim 1, further comprising:
a dielectric layer between the barrier layer and the channel region.

11. The domain switching device of claim 10, wherein the dielectric layer includes a different total material composition than a total material composition of the barrier layer.

12. The domain switching device of claim 10, wherein a dielectric constant of the barrier layer is greater than a dielectric constant of the dielectric layer.

13. The domain switching device of claim 10, wherein the dielectric layer includes SiO, AlO, HfO, ZrO, or a 2D insulator.

14. The domain switching device of claim 1, wherein the anti-ferroelectric layer includes at least one of HfO, ZrO, SiO, AlO, CeO, YO, or LaO.

15. The domain switching device of claim 14, wherein the anti-ferroelectric layer further includes a dopant, and the dopant includes at least one of Si, Al, Zr, Y, La, Gd, Sr, Hf, or Ce.

16. The domain switching device of claim 1, wherein the channel region includes at least one of Si, Ge, SiGe, a Group III-V semiconductor, an oxide semiconductor, a nitride semiconductor, an oxynitride semiconductor, a 2D material, a quantum dot, a transition metal dichalcogenide, or an organic semiconductor.

17. A method of manufacturing a domain switching device, the method comprising:
preparing a substrate including a channel region;
forming, on the channel region, a lamination structure including a barrier layer, a domain switching layer, and a conductive layer;
forming an electrode material layer on the lamination structure; and
inducing anti-ferroelectricity in the domain switching layer, wherein the inducing of the anti-ferroelectricity in the domain switching layer includes at least one of
crystallizing at least a portion of the domain switching layer,
applying tensile stress to the domain switching layer, or
annealing the lamination structure.

18. The method of claim 17, wherein the domain switching layer includes at least one of HfO, ZrO, SiO, AlO, CeO, YO, or LaO.

19. The method of claim 17, wherein the conductive layer includes a metal nitride, a metal oxynitride, RuO, MoO, or WO.

20. The method of claim 17, wherein
the inducing of the anti-ferroelectricity in the domain switching layer includes annealing the lamination structure, and
the annealing of the lamination structure is performed
before the electrode material layer is formed after the lamination structure is formed, and/or
after the electrode material layer is formed.

21. A method of manufacturing an electronic device, the method comprising:
forming a domain switching device according to the method of claim 17; and
fabricating the electronic device based on incorporating the domain switching device into an electronic device component.

22. The method of claim 21, wherein the electronic device component includes at least one of a processing circuitry or a memory.

23. A system for forming a domain switching device, the system comprising:
a process chamber including a pedestal or chuck configured to structurally support a substrate in the process chamber, the substrate including a channel region;

a plurality of composition sources and a plurality of control devices, each composition source coupled to the process chamber via a separate control device, each control device configured to control a supply of a separate material held in a separate coupled composition source to the process chamber; and an electronic device configured to control at least the plurality of control devices to
- form, on the channel region of the substrate in the process chamber, a lamination structure including a barrier layer, a domain switching layer, and a conductive layer;
- form an electrode material layer on the lamination structure; and
- induce anti-ferroelectricity in the domain switching layer based on at least one of
  - causing at least a portion of the domain switching layer to be crystallized,
  - causing a tensile stress to be applied to the domain switching layer, or
  - annealing the lamination structure.

24. The system of claim 23, further comprising:
a heat source configured to heat at least a portion of the process chamber,
wherein the electronic device is configured to control the heat source to cause the annealing of the lamination structure to induce the anti-ferroelectricity in the domain switching layer.

25. The system of claim 24, wherein the electronic device is configured to control the heat source to cause the annealing of the lamination structure to be performed
before the electrode material layer is formed after the lamination structure is formed, and/or
after the electrode material layer is formed.

26. The system of claim 24, wherein the electronic device is configured to control at least the plurality of control devices to
prepare the substrate to include the channel region prior to forming the lamination structure on the channel region, based on injecting dopants into two separate regions of the substrate, the two separate regions isolated from contact with each other, to form a source and a drain in the two separate regions and to define the channel region as a region external to and between the source and the drain in the substrate.

* * * * *